United States Patent
Morino et al.

(10) Patent No.: US 11,329,632 B2
(45) Date of Patent: May 10, 2022

(54) VARIABLE INDUCTOR CIRCUIT

(71) Applicant: Mitsubishi Electric Corporation, Tokyo (JP)

(72) Inventors: Yoshiaki Morino, Tokyo (JP); Mitsuhiro Shimozawa, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 7 days.

(21) Appl. No.: 16/994,102

(22) Filed: Aug. 14, 2020

(65) Prior Publication Data

US 2020/0373912 A1 Nov. 26, 2020

Related U.S. Application Data

(63) Continuation of application No. PCT/JP2018/009005, filed on Mar. 8, 2018.

(51) Int. Cl.
*H03H 11/28* (2006.01)
*H03B 5/08* (2006.01)
*H03F 3/19* (2006.01)

(52) U.S. Cl.
CPC ............ *H03H 11/28* (2013.01); *H03B 5/08* (2013.01); *H03F 3/19* (2013.01)

(58) Field of Classification Search
CPC ............ H03H 11/28; H03B 5/08; H03F 3/19
USPC ........................................................ 330/302
See application file for complete search history.

(56) References Cited

U.S. PATENT DOCUMENTS

| 6,114,930 A | 9/2000 | Gobbi et al. |
| 9,853,614 B2* | 12/2017 | Wang ................ H03F 1/223 |
| 2003/0080846 A1 | 5/2003 | Chang et al. |
| 2004/0066236 A1* | 4/2004 | Fujimoto ............ H03B 5/1209 |
| | | 330/302 |
| 2006/0232348 A1 | 10/2006 | Hino |
| 2009/0251218 A1* | 10/2009 | Oliveira ................ H03G 3/10 |
| | | 330/278 |
| 2013/0069165 A1 | 3/2013 | Nedovic |
| 2014/0368290 A1 | 12/2014 | Sato |

FOREIGN PATENT DOCUMENTS

| JP | 2000-501263 A | 2/2000 |
| JP | 2004-165612 A | 6/2004 |
| JP | 2006-303776 A | 11/2006 |
| JP | 2009-152254 A | 7/2009 |
| JP | 2013-70375 A | 4/2013 |
| JP | 2015-2398 A | 1/2015 |

OTHER PUBLICATIONS

International Search Report (PCT/ISA/210) issued in PCT/JP2018/009005, dated May 29, 2018.
Notice of Reasons for Refusal issued in Japanese Patent Application No. 2018-539451, dated Oct. 30, 2018.

* cited by examiner

*Primary Examiner* — Hafizur Rahman
(74) *Attorney, Agent, or Firm* — Birch, Stewart, Kolasch & Birch, LLP

(57) ABSTRACT

One inductor and another inductor are magnetically coupled to each other. A variable current source controls the current flowing in the one inductor. By controlling the current flowing in the one inductor, the inductance value of the other inductor is made variable.

6 Claims, 5 Drawing Sheets

VARIABLE INDUCTOR CIRCUIT

CROSS REFERENCE TO RELATED APPLICATIONS

This application is a Continuation of PCT International Application No. PCT/JP2018/009005, filed on Mar. 8, 2018, all of which is hereby expressly incorporated by reference into the present application.

TECHNICAL FIELD

The present invention relates to a variable inductor circuit capable of electrically adjusting an inductance value.

BACKGROUND ART

In high frequency circuits used for wireless communication, a matching circuit that supports the operation frequency is included. The matching circuit achieves impedance matching between circuits and reduces power reflection between the circuits, thus resulting in good characteristics. In matching circuits, resistors, capacitors, and inductors are used. Since an inductor is generally formed of metal wiring having an inductance component, the inductance value cannot be easily adjusted, and thus a change in the operation frequency results in deterioration of the performance of the circuit.

Therefore, examples of conventional methods for electrically adjusting the inductance value include a variable inductor circuit based on a gyrator that converts a capacitive circuit into an inductive circuit. However, such a variable inductor circuit resonates as the frequency increases, and thus it is difficult to adjust the inductance value in a high frequency band of 30 GHz or higher.

In order to solve this problem, for example Patent Literature 1 illustrates a variable inductor circuit in which transistors having a small parasitic capacitance are used, the mutual conductance (gm) of two transistors coupled in cascade is made variable, and, of the two transistors, an apparent gate-source capacitance (Cgs) of the transistor coupled to the ground (GND) side is made variable, and which can be used also in a high-frequency band.

CITATION LIST

Patent Literatures

Patent Literature 1: JP 2015-2398 A

SUMMARY OF INVENTION

Technical Problem

However, although the above variable inductor circuit of the related art illustrates a variable inductor that can be used even in a high frequency band, since a varactor diode is used to change the apparent Cgs, and for this end, a DC voltage source around 20 V is necessary as a control voltage, there is a disadvantage that the mounting cost increases.

The present invention has been devised in order to solve the disadvantage as described above, and it is an object of the invention to provide a variable inductor circuit capable of suppressing the mounting cost and electrically adjusting the inductance value even in a high frequency band.

Solution to Problem

A variable inductor circuit according to the present invention includes one inductor and another inductor magnetically coupled to each other; a cascode amplifier for controlling a current flowing in the one inductor; and a control current source coupled to a collector terminal of a transistor, an emitter of which is grounded, of the cascode amplifier, wherein a high-frequency voltage is applied to the cascode amplifier from a terminal of the other inductor via a buffer circuit, and a current of the control current source is changed to change a current flowing in the cascode amplifier to cause an inductance value of the other inductor to be variable.

Advantageous Effects of Invention

In the variable inductor circuit of the present invention, the cascode amplifier in which the current changes controls the current flowing in the one inductor to cause the inductance value of the other inductor to be variable. As a result, it becomes possible to suppress the mounting cost and to electrically adjust the inductance value even in a high frequency band.

DESCRIPTION OF EMBODIMENTS

To describe the present invention further in detail, embodiments for carrying out the present invention will be described below with reference to the accompanying drawings.

First Embodiment

Figure 1:
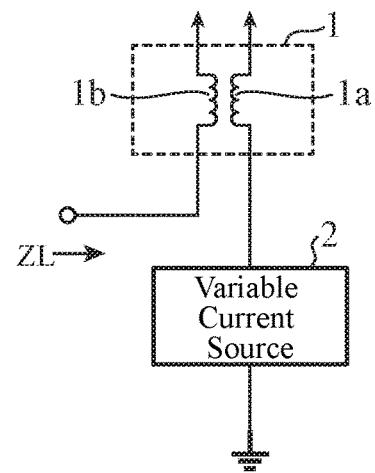
FIG. 1 is a configuration diagram illustrating a variable inductor circuit according to a first embodiment of the present invention.

FIG. 1 is a configuration diagram illustrating a variable inductor circuit according to the present embodiment.

The variable inductor circuit illustrated in FIG. 1 includes: inductors 1 that are magnetically coupled to each other and a variable current source 2. Of the inductors 1, one end of each of one inductor 1a and another inductor 1b is coupled to a voltage source (not illustrated), and the other end of the inductor 1a is coupled with the variable current source 2. The inductance value of the inductor 1a is denoted by symbol "L1", and the inductance value of the other inductor 1b is denoted by symbol "L2". The terminal, coupled to the voltage source, of the other inductor 1b can be coupled with the ground potential. The other side of the variable current source 2 opposite to the coupling side with the inductor 1a is grounded to control the current flowing in the inductor 1a. Note that the inductor 1a and the other inductor 1b may be metal wiring having inductance values of L1 and L2, respectively.

In the following description of each embodiment, a high frequency band of 30 GHz or more is assumed as a frequency to be applied to the variable inductor circuit; however, no limitation is intended to this frequency band.

Next, the operation of the variable inductor circuit according to the first embodiment will be described.

The current of the variable current source 2 is controlled to change the current flowing in the inductor 1a. Here, the magnetic flux and the current satisfies the relationship expressed by equation (1). In the following equation (1), character "Φ" represents the magnetic flux, character "L" represents the inductance, and character "I" represents the current.

$$\Phi = L \times I \quad (1)$$

By making the current flowing in the inductor 1a variable, the magnetic flux Φ1 generated in the inductor 1a also varies. The other inductor 1b is magnetically coupled with the inductor 1a and generates a mutual inductance M ($=K\sqrt{(L1 \times L2)}$), and the coupling coefficient K changes due to the change of Φ1, thereby changing the mutual inductance M. As a result, the inductance value as viewed from ZL illustrated in FIG. 1 (inductance value as the variable inductor circuit) can be made variable.

Figure 2:
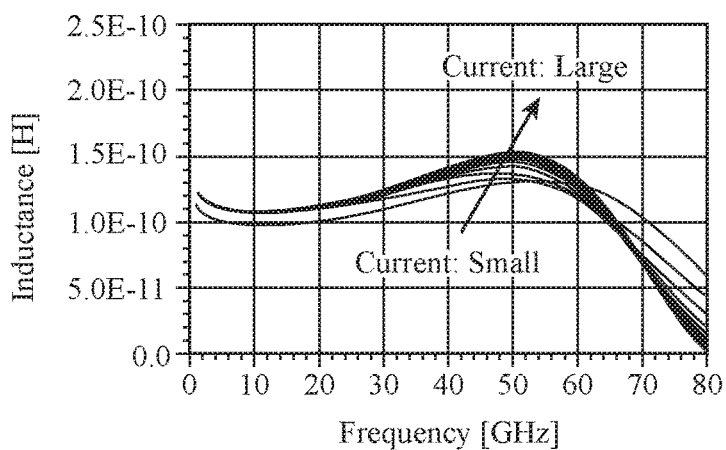
FIG. 2 is an explanatory graph illustrating changes in the inductance value of the variable inductor circuit according to the first embodiment of the present invention.
Figure 3:
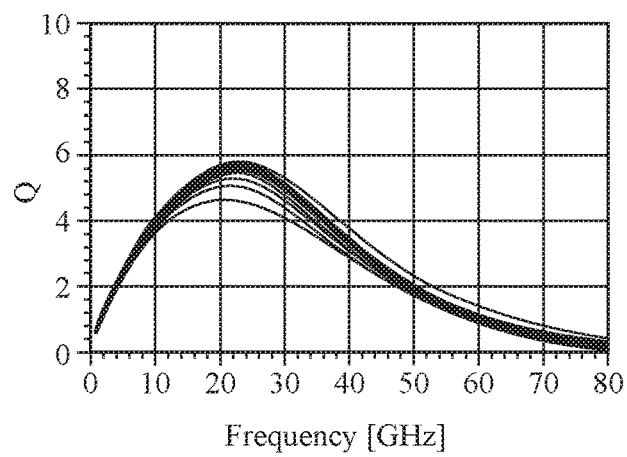
FIG. 3 is an explanatory graph illustrating changes in the Q value of the variable inductor circuit according to the first embodiment of the present invention.

FIGS. 2 and 3 are graphs illustrating simulation results of the inductance value and the Q value of the variable inductor circuit when the variable current source 2 is controlled to change the current flowing in the inductor 1a. It can be understood that the inductance value and the Q value when viewed from ZL can be made variable by changing the current.

As described above, the variable inductor circuit of the first embodiment includes: the one inductor and the other inductor magnetically coupled to each other; and the variable current source for controlling the current flowing in the one inductor, in which the variable current source controls the current flowing in the one inductor to cause the inductance value of the other inductor to be variable. Therefore, it becomes possible to suppress the mounting cost and to electrically adjust the inductance value even in a high frequency band.

Second Embodiment

In a second embodiment, a high-frequency voltage input to a circuit is used as a control voltage for a gm (transconductance) element to control a current flowing in one inductor.

Figure 4:
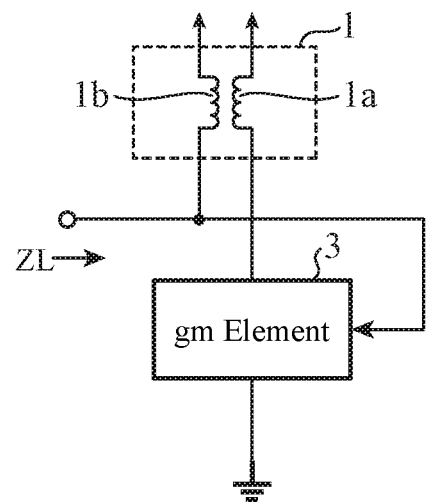
FIG. 4 is a configuration diagram illustrating a variable inductor circuit according to a second embodiment of the present invention.

FIG. 4 is a configuration diagram of a variable inductor circuit according to the second embodiment.

The variable inductor circuit of the second embodiment includes inductors 1 including one inductor 1a and another inductor 1b magnetically coupled to each other and a gm element 3. The inductor 1a and the other inductor 1b are similar to the inductor 1a and the other inductor 1b of the first embodiment. The gm element 3 is an element that controls the current flowing in the inductor 1a, and one end is coupled to the inductor 1a and the other end is grounded. The gm element 3 is controlled by a high frequency voltage that is supplied to the other inductor 1b.

Figure 5:
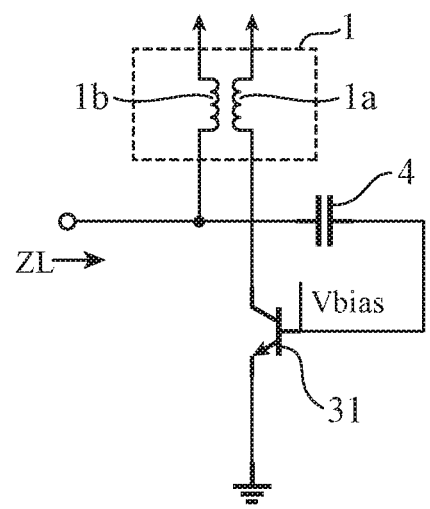
FIG. 5 is a configuration diagram illustrating a specific example of a gm element of the variable inductor circuit according to the second embodiment of the present invention.

In FIG. 5, a specific example of the gm element 3 is illustrated. For the gm element 3, a bipolar transistor 31 is used, and a capacitor 4 is coupled for applying a DC voltage (Vbias) to the base terminal.

Figure 6:
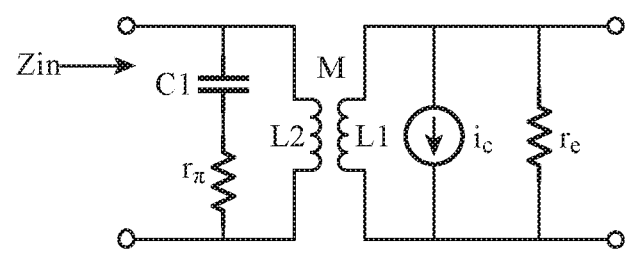
FIG. 6 is a circuit diagram illustrating an equivalent circuit of the variable inductor circuit according to the second embodiment of the present invention.

Next, the operation of the circuit illustrated in FIG. 5 will be described. In FIG. 6, a small signal equivalent circuit of the circuit of FIG. 5 is illustrated. In the figure, symbols "L1" and "L2" correspond to the inductor 1a and the other inductor 1b that are magnetically coupled, and symbol "M" denotes the mutual inductance of L1 and L2. Symbol "C1" denotes the capacitance of the capacitor 4, symbol "$r_\pi$" denotes the input resistance of the bipolar transistor 31, symbol "$r_e$" denotes the output resistance of the bipolar transistor 31, and symbol "$i_c$" denotes the collector current of the bipolar transistor 31. The input impedance Zin of this small signal equivalent circuit can be expressed by equation (2).

$$Zin = \{j\omega L2 // (r_\pi - j(1/(\omega C1)))\} + \omega^2 M^2 / (j\omega L1 + 1/gm) \quad (2)$$

* In the equation, // indicates parallel connection.

Here, a relationship of $r_\pi = \beta/gm$ holds. Symbol "β" denotes the current amplification factor of the bipolar transistor 31, and symbol "gm" denotes the mutual conductance of the bipolar transistor 31. In the circuits illustrated in FIGS. 5 and 6, the inductance value of the other inductor 1b can be changed by controlling $r_\pi$ coupled in parallel to the other inductor 1b, that is, gm.

Figure 7:
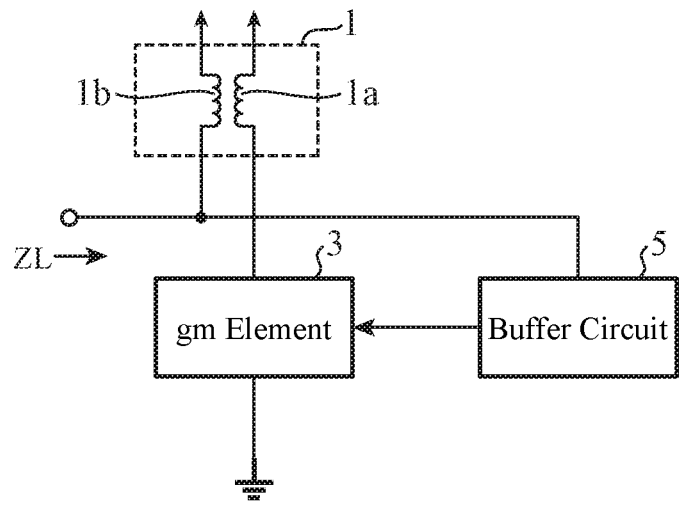
FIG. 7 is a configuration diagram illustrating an example of the variable inductor circuit, according to the second embodiment of the present invention, coupled to a buffer circuit.
Figure 8:
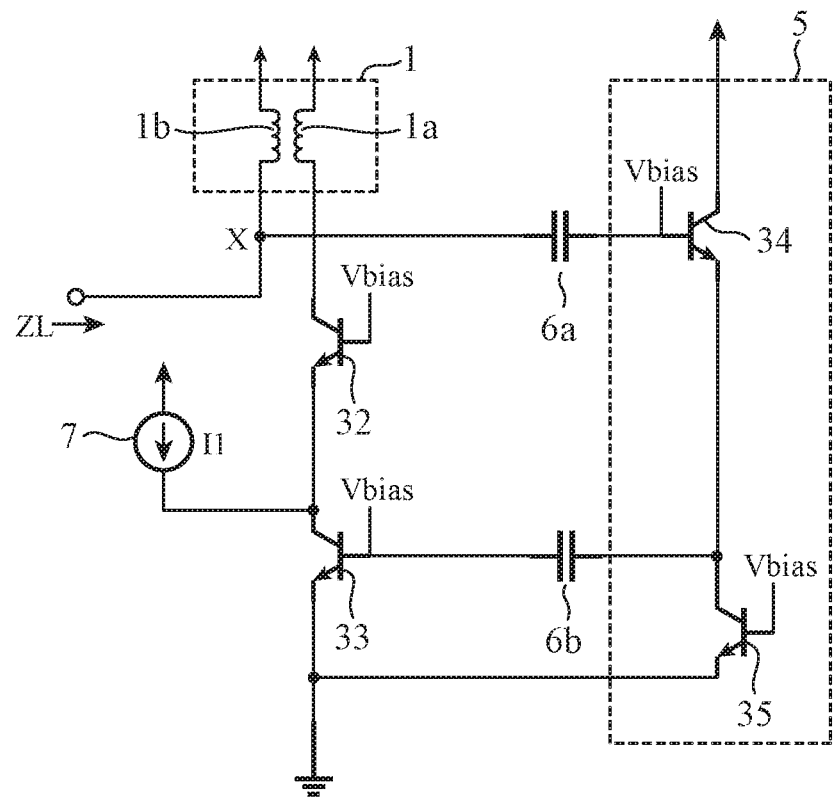
FIG. 8 is a configuration diagram illustrating a specific example of the variable inductor circuit, according to the second embodiment of the present invention, illustrated in FIG. 7.

In FIG. 7, a configuration is illustrated as a more specific circuit example in which the buffer circuit 5 is coupled as the preceding stage of an input terminal of the control voltage of the gm element 3. FIG. 8 illustrates a specific circuit configuration of the gm element 3 and the buffer circuit 5. The inductor 1a and the other inductor 1b are magnetically coupled to each other. One end of each of the inductor 1a and the other inductor 1b is coupled to a voltage source, and the other end of the inductor 1a is coupled to a cascode amplifier (first transistor 32 and second transistor 33) as the gm element 3. The other end of the other inductor 1b is coupled to the base terminal of the second transistor 33 via a first capacitor 6a, the buffer circuit 5 including a third transistor 34 and a fourth transistor 35 (here, an emitter follower circuit), and a second capacitor 6b. A control current source 7 is coupled to the collector terminal of the second transistor 33. With the cascode amplifier coupled to the inductor 1a, gm expressed by equation (2) is apparently increased, thereby expanding the variable range of the inductance value. The buffer circuit 5 mitigates reflection of a high-frequency voltage between point X and the second transistor 33. The control current source 7 can make the direct current flowing in the first transistor 32 variable, and thus is used for controlling the inductance value.

Figure 9:
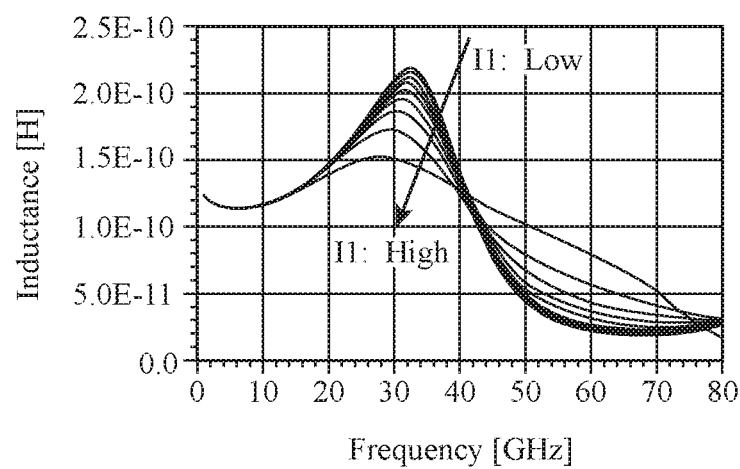
FIG. 9 is an explanatory graph illustrating changes in the inductance value of the variable inductor circuit according to the second embodiment of the present invention.
Figure 10:
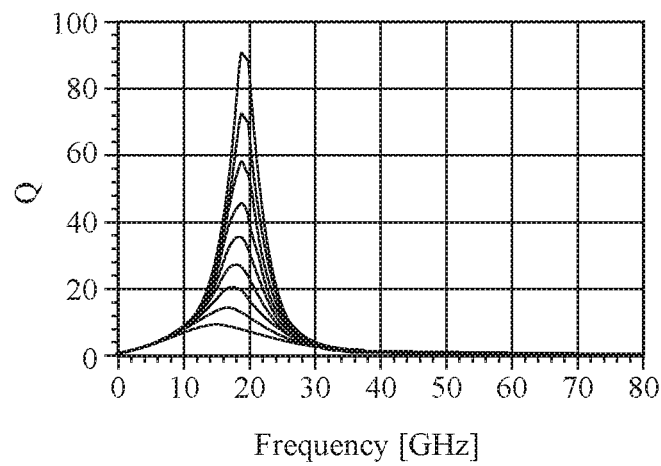
FIG. 10 is an explanatory graph illustrating changes in the Q value of the variable inductor circuit according to the second embodiment of the present invention.

FIGS. 9 and 10 are graphs illustrating simulation results of the inductance value and the Q value when the current value (I1) of the control current source 7 is controlled to change the current flowing in the inductor 1a. The vertical axis in FIG. 9 represents the inductance (Inductance [H]), the vertical axis in FIG. 10 represents the Q value, and the horizontal axes in FIGS. 9 and 10 represent the frequency (Frequency [GHz]). From these drawings, it can be understood that the inductance value and the Q value when viewed from ZL can be made variable by changing the current. Furthermore, it can be understood that the variable range of the inductance value is expanded and that the Q value is improved than in the first embodiment.

Figure 11:
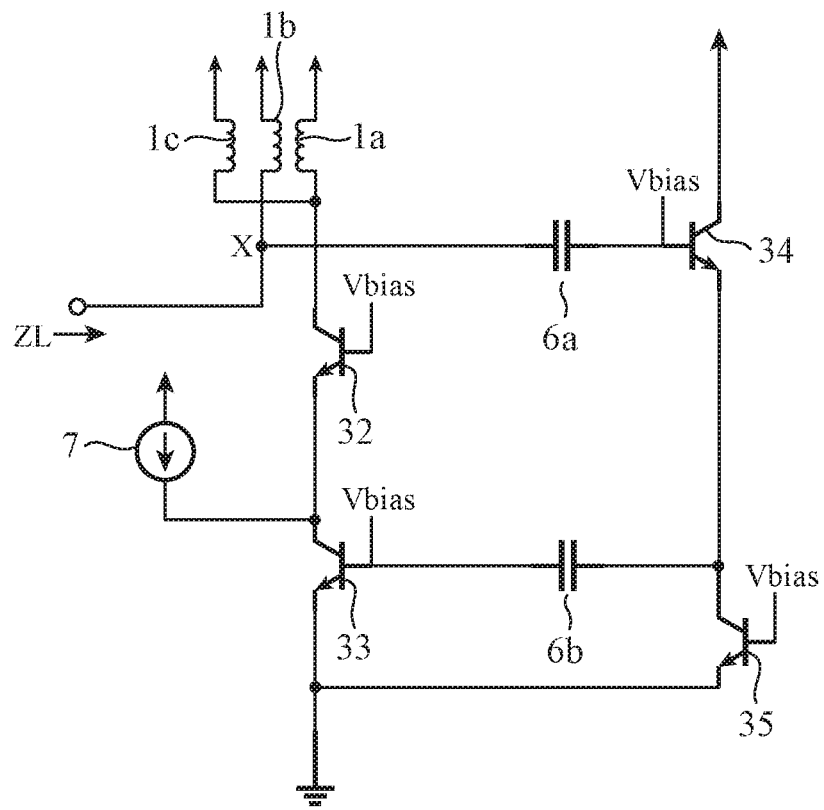
FIG. 11 is a configuration diagram illustrating another example of the variable inductor circuit according to the second embodiment of the present invention.

Note that, although the inductor 1a and the other inductor 1b have been described as the inductors 1 that are magnetically coupled to each other; however, similar effects can be obtained even with three inductors (the inductor 1a, the other inductor 1b, and a third inductor 1c) as illustrated in FIG. 11. Note that in FIG. 11, the third inductor 1c is coupled in parallel with the inductor 1a, and the other configuration is similar to that in FIG. 8. Alternatively, similar effects can be obtained even when three or more inductors are targeted. Note that in a case where there are three or more inductors are used, the inductance value of one inductor is made variable by controlling the current flowing in the inductors other than that inductor.

As described above, the variable inductor circuit of the second embodiment includes: the one inductor and the other inductor magnetically coupled to each other; and the gm element for controlling the current flowing in the one inductor, in which the gm element is controlled by a terminal voltage of the other inductor, thereby controlling a current flowing in the one inductor to cause an inductance value of the other inductor to be variable. Therefore, the variable range of the inductance value can be expanded and the Q value can be improved in addition to the effects of the first embodiment.

Moreover, the variable inductor circuit of the second embodiment includes: the one inductor and the other inductor magnetically coupled to each other; the cascode amplifier for controlling the current flowing in the one inductor; and the control current source coupled to the collector terminal of the transistor, the emitter of which is grounded, of the cascode amplifier, in which a high-frequency voltage is applied to the cascode amplifier from a terminal of the other inductor via the buffer circuit, and the current of the control current source is changed to change the current flowing in the cascode amplifier to cause the inductance value of the other inductor to be variable. Therefore, the variable range of the inductance value can be expanded and the Q value can be improved in addition to the effects of the first embodiment.

In addition, the variable inductor circuit of the second embodiment includes three or more inductors magnetically coupled to each other, the three or more inductors including the one inductor and the other inductor, in which the inductance value of the one inductor is made variable by controlling the current flowing in the inductors other than the one inductor out of the three or more inductors. Therefore, also for the configuration in which three or more inductors are magnetically coupled to each other, it becomes possible to suppress the mounting cost and to electrically adjust the inductance value even in a high frequency band.

Third Embodiment

Figure 12:
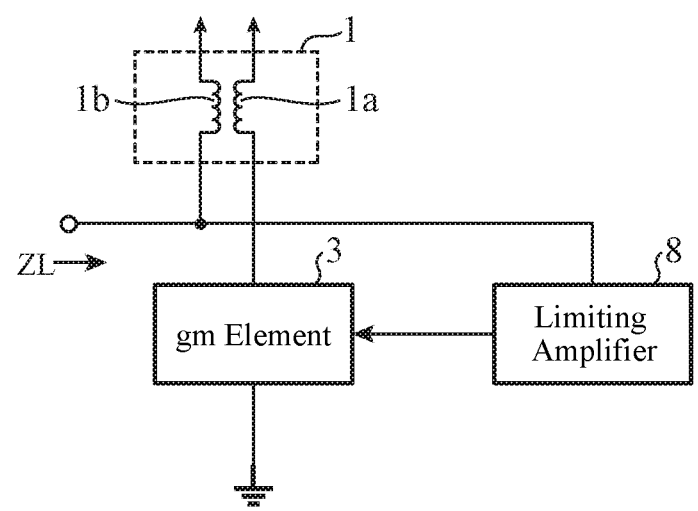
FIG. 12 is a configuration diagram illustrating a variable inductor circuit according to a third embodiment of the present invention.

The gm element 3 is controlled via the buffer circuit 5 in the second embodiment; however, a limiting amplifier may be used instead of the buffer circuit 5, and this will be described as a third embodiment. FIG. 12 is a configuration diagram of a variable inductor circuit according to the third embodiment.

As illustrated in FIG. 12, a limiting amplifier 8 is coupled instead of the buffer circuit 5 of the second embodiment illustrated in FIG. 7. For example, in a case where the amplitude of the high-frequency voltage input to the variable inductor circuit is not constant, the gm value of the gm element 3 disadvantageously changes, thereby causing the inductance value when viewed from ZL to change. On the other hand, by coupling the limiting amplifier 8 as illustrated in FIG. 12, the gm value of the gm element 3 can be kept constant, and the inductance value when viewed from ZL can also be kept constant.

Note that the third embodiment can also be applied to three or more inductors like the configuration illustrated in FIG. 11 of the second embodiment.

As described above, since the limiting amplifier is used in the variable inductor circuit of the third embodiment instead of the buffer circuit of the second embodiment, the inductance value of the variable inductor circuit can be kept constant even in a case where the amplitude of the high-frequency voltage input to the variable inductor circuit is not constant.

Note that the present invention may include a flexible combination of the respective embodiments, a modification of any component of the embodiments, or an omission of any component in the embodiments within the scope of the present invention.

INDUSTRIAL APPLICABILITY

As described above, a variable inductor circuit according to the present invention relates to a configuration for electrically adjusting an inductance value, and is suitable for use in a matching circuit of a high frequency circuit.

REFERENCE SIGNS LIST

1: Inductor,
1a: One inductor
1a and 1b: Another inductor,
2: Variable current source,
3: gm element,
4: Capacitor,
5: Buffer circuit,
6a: First capacitor,
6b: Second capacitor,
7: Control current source, and
8: Limiting amplifier.

What is claimed is:
1. A variable inductor circuit comprising:
one inductor and another inductor magnetically coupled to each other;
a cascode amplifier for controlling a current flowing in the one inductor; and
a control current source coupled to a collector terminal of a transistor, an emitter of which is directly grounded, of the cascode amplifier,
wherein a high-frequency voltage is applied to the cascode amplifier from a terminal of the another inductor via a buffer circuit, and a current of the control current source is changed to change a current flowing in the cascode amplifier to cause an inductance value of the another inductor to be variable.

2. A variable inductor circuit, comprising:
one inductor and another inductor magnetically coupled to each other;
a cascode amplifier for controlling a current flowing in the one inductor; and
a control current source coupled to a collector terminal of a transistor, an emitter of which is grounded, of the cascode amplifier,
wherein a high-frequency voltage is applied to the cascode amplifier from a terminal of the another inductor via a buffer circuit, and a current of the control current source is changed to change a current flowing in the cascode amplifier to cause an inductance value of the another inductor to be variable,
wherein a limiting amplifier is used instead of the buffer circuit.

3. The variable inductor circuit according to claim 1, further comprising:
three or more inductors magnetically coupled to each other, the three or more inductors including the one inductor and the another inductor,
wherein currents flowing in inductors other than the one inductor out of the three or more inductors are controlled to cause an inductance value of the one inductor to be variable.

4. The variable inductor circuit according to claim 2, further comprising:
three or more inductors magnetically coupled to each other, the three or more inductors including the one inductor and the another inductor,
wherein currents flowing in inductors other than the one inductor out of the three or more inductors are controlled to cause an inductance value of the one inductor to be variable.

5. A variable inductor circuit comprising:
an input terminal;
a buffer circuit or a limiting amplifier;
a first inductor and a second inductor magnetically coupled to each other, the second inductor being coupled to the input terminal;
a cascode amplifier coupled to the first inductor and configured for controlling a current flowing in the first inductor, the cascode amplifier comprising a first transistor and a second transistor, an emitter of the second transistor being grounded; and
a control current source coupled to a collector terminal of the second transistor of the cascode amplifier,
wherein the variable inductor circuit is configured such that a high-frequency voltage is applied to the cascode amplifier from the input terminal via the buffer circuit or the limiting amplifier, and a current of the control current source is changed to change a current flowing in the cascode amplifier to cause an inductance value of the variable inductor circuit as viewed from the input terminal to be variable.

6. The variable inductor circuit according to claim 5, further comprising:
a third inductor magnetically coupled to the first inductor and the second inductor,
wherein the cascode amplifier is coupled to the third inductor for controlling a current flowing in the third inductor.

* * * * *